(12) United States Patent
Zheng et al.

(10) Patent No.: US 12,396,338 B2
(45) Date of Patent: Aug. 19, 2025

(54) OLED DISPLAY PANEL WITH AN OPENING DEFINED IN AN INSULATION LAYER CORRESONDING TO ANODE, AND MANUFACTURING METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventors: Shuai Zheng, Guangdong (CN); Zhaosong Liu, Guangdong (CN)

(73) Assignee: Shenzhen China Star Optoelectronics Semiconductor Display Technology Co., Ltd, Guangdong (CN)

( * ) Notice: Subject to any disclaimer, the term of this patent is extended or adjusted under 35 U.S.C. 154(b) by 0 days.

(21) Appl. No.: 17/755,149

(22) PCT Filed: Apr. 15, 2022

(86) PCT No.: PCT/CN2022/087117
§ 371 (c)(1),
(2) Date: Apr. 21, 2022

(87) PCT Pub. No.: WO2023/178764
PCT Pub. Date: Sep. 28, 2023

(65) Prior Publication Data
US 2024/0138209 A1   Apr. 25, 2024
US 2024/0237431 A9   Jul. 11, 2024

(30) Foreign Application Priority Data

Mar. 24, 2022   (CN) .......................... 202210297933.6

(51) Int. Cl.
*H10K 59/131*   (2023.01)
*H10K 59/12*    (2023.01)
(Continued)

(52) U.S. Cl.
CPC ....... *H10K 59/131* (2023.02); *H10K 59/1201* (2023.02); *H10K 59/123* (2023.02);
(Continued)

(58) Field of Classification Search
CPC ................................................... H10K 59/131
(Continued)

(56) References Cited

U.S. PATENT DOCUMENTS

| | | | |
|---|---|---|---|
| 2006/0125381 A1* | 6/2006 | Oh | ........ H10K 59/121 313/504 |
| 2013/0207087 A1* | 8/2013 | Kim | ...... H10K 59/123 438/23 |
| 2018/0122882 A1* | 5/2018 | Lee | ...... H01L 27/1248 |

FOREIGN PATENT DOCUMENTS

| | | |
|---|---|---|
| CN | 103247659 A | 8/2013 |
| CN | 107293554 A * | 10/2017 |

(Continued)

OTHER PUBLICATIONS

International Search Report in International application No. PCT/CN2022/087117, mailed on Dec. 16, 2022.
(Continued)

*Primary Examiner* — Ajay Arora
(74) *Attorney, Agent, or Firm* — PV IP PC; Wei Te Chung

(57) ABSTRACT

The present application discloses an OLED display panel and a manufacturing method thereof. The OLED display panel includes: a base layer, an active layer, a gate insulating layer, a first metal layer, and a second metal layer, wherein the active layer includes a channel portion, a source contact portion, a first electrode, and an anode; the second metal layer is arranged above the first metal layer and connected to the source contact portion; the insulating layer, the first metal layer, and the second metal layer are stacked, and an
(Continued)

opening is defined in the insulating layer at the position corresponding to the anode.

17 Claims, 9 Drawing Sheets

(51) Int. Cl.
    *H10K 59/123*     (2023.01)
    *H10K 59/126*     (2023.01)
    *H10K 71/00*     (2023.01)
    *H10K 71/60*     (2023.01)

(52) U.S. Cl.
    CPC ........... *H10K 59/126* (2023.02); *H10K 71/60* (2023.02); *H10K 71/621* (2023.02)

(58) Field of Classification Search
    USPC .......................................................... 257/40
    See application file for complete search history.

(56) References Cited

FOREIGN PATENT DOCUMENTS

| | | |
|---|---|---|
| CN | 107293555 A | 10/2017 |
| CN | 107305907 A | 10/2017 |
| CN | 108598145 A | 9/2018 |
| CN | 109244276 A | 1/2019 |
| CN | 110649037 A | 1/2020 |
| CN | 111081737 A | 4/2020 |
| KR | 20130071997 A | 7/2013 |

OTHER PUBLICATIONS

Written Opinion of the International Search Authority in International application No. PCT/CN2022/087117, mailed on Dec. 16, 2022.

* cited by examiner

OLED DISPLAY PANEL WITH AN OPENING DEFINED IN AN INSULATION LAYER CORRESONDING TO ANODE, AND MANUFACTURING METHOD THEREOF

BACKGROUND OF INVENTION

Field of Invention

The present application relates to the field of display, and in particular, to an OLED display panel and a manufacturing method thereof.

Description of Prior Art

With the development of OLED technology, IGZO materials are widely used in the OLED panel industry due to their advantages of lower leakage current and better mobility than a-Si.

IGZO materials can be widely used in production of top-gate driven array substrates. At present, the display panel using IGZO as an active layer material uses a large number of photomasks in a production process. As shown in FIG. 1, a structure of the display panel includes: a substrate Gla, a light-shielding portion LS disposed on the substrate, a buffer layer Buf disposed on the light-shielding portion LS, an active layer disposed on the buffer layer Buf, a source S and a drain D connected to the active layer, a gate electrode and a gate insulating layer disposed on the active layer, wherein the source electrode S and the anode PE above the source electrode S are connected to each other through the metal layer, and a dielectric layer ILD configured to provide insulation between layers, a passivation layer PV, a planarization layer PLN configured to ensure flatness between the layers, and a pixel definition layer BANK configured to separate the electroluminescent layer. The formation of the light-shielding layer LS, the active layer, the gate insulating layer, the gate layer, via holes connected between layers, and so on requires a total of 11 photomasks. The photomasks are used frequently and are expensive to produce.

Therefore, there is an urgent need for an array substrate structure with low production cost and a small number of photomasks used.

SUMMARY OF INVENTION

Embodiments of the present application provide an OLED display panel and a manufacturing method thereof, so as to solve the technical problem that a large number of photomasks is required for the manufacturing process of a display panel using IGZO as an active layer material.

In order to solve the above-mentioned problems, the technical solutions provided by the present application are as follows:

Embodiments of the present application provide an OLED display panel, including:
- a base layer;
- an active layer disposed on the base layer, wherein the active layer includes a channel portion, a source contact portion and a first electrode disposed on opposite sides of the channel portion, and an anode connected to the first electrode;
- a gate insulating layer disposed on the channel portion;
- a first metal layer disposed on the gate insulating layer;
- a second metal layer disposed above the first metal layer and including a second electrode connected to the source contact portion; and
- an insulating layer disposed on the base layer and the active layer, wherein the insulating layer, the first metal layer, and the second metal layer are stacked, and an opening is defined in the insulating layer corresponding to the anode.

In one embodiment, a resistivity of the source contact portion, the first electrode, and the anode is smaller than a resistivity of the channel portion.

In one embodiment, the active layer further includes a signal line segment, the first electrode is connected to the signal line segment, and a material of the signal line segment is same as a material of the first electrode.

In one embodiment, the base layer includes a substrate, a light-shielding layer, and a buffer layer stacked in sequence; a first via hole is defined above the light-shielding layer, the first via hole penetrates at least the buffer layer, and the first electrode is connected to the light-shielding layer through the first via hole.

In one embodiment, the insulating layer includes a first insulating layer disposed on the active layer, the second metal layer is disposed on the first insulating layer, a second via hole is defined in the first insulating layer at a position corresponding to the second electrode and the source contact portion, and the second electrode is connected to the source connection portion through the second via hole.

In one embodiment, the active layer further includes a signal line segment, the first electrode is connected to the signal line segment, and a material of the signal line segment is same as a material of the first electrode.

In one embodiment, the insulating layer further includes a second insulating layer and a pixel definition layer which are stacked, the second insulating layer is disposed on the first insulating layer and the second metal layer, the opening is defined in the pixel definition layer, and a fifth via hole is defined in the first insulating layer and the second insulating layer at a position corresponding to the anode, and the opening is located in the fifth via hole.

In one embodiment, the second metal layer further includes a bridge segment disposed on the first insulating layer; and
wherein the first insulating layer is defined with a third via hole at a position corresponding to the first electrode, a fourth via hole is defined in the first insulating layer, and the first electrode is connected to the anode through the bridge segment passing through the third via hole and the fourth via hole.

In one embodiment, the first via hole penetrates the first insulating layer, and the first electrode is connected to the light-shielding layer through the bridge segment passing through the third via hole and the first via hole.

In one embodiment, the insulating layer further includes a second insulating layer and a pixel definition layer which are stacked, the second insulating layer is disposed on the first insulating layer and the second metal layer, the opening is defined in the pixel definition layer, and a fifth via hole is defined in the first insulating layer and the second insulating layer at a position corresponding to the anode, and the opening is located in the fifth via hole.

In one embodiment, the active layer further includes a signal line segment, the first electrode is connected to the signal line segment, and a material of the signal line segment is same as a material of the first electrode.

In one embodiment, the insulating layer further includes a second insulating layer and a pixel definition layer which are stacked, the second insulating layer is disposed on the first insulating layer and the second metal layer, the opening is defined in the pixel definition layer, and a fifth via hole is defined in the first insulating layer and the second insulating layer at a position corresponding to the anode, and the opening is located in the fifth via hole.

In one embodiment, the second metal layer further includes an auxiliary electrode disposed on the second insulating layer, a sixth via hole is defined in the second insulating layer at a position corresponding to the auxiliary electrode, a seventh via hole is defined in the pixel definition layer at a position corresponding to the sixth via hole; and wherein the OLED display panel includes an electroluminescence layer disposed on the anode, a cathode layer disposed on the electroluminescence layer and the pixel definition layer, and the cathode layer is connected to the auxiliary electrode through the fifth via hole and the sixth via hole.

In one embodiment, a diameter of the seventh via hole is smaller than a diameter of the sixth via hole.

In one embodiment, the active layer further includes a signal line segment, the first electrode is connected to the signal line segment, and a material of the signal line segment is same as a material of the first electrode.

In one embodiment, the active layer further includes a signal line segment, the first electrode is connected to the signal line segment, and a material of the signal line segment is same as a material of the first electrode.

The present application also provides a method of manufacturing an OLED display panel, including the following steps:

providing a base layer;

forming an active layer on the base layer, wherein the active layer includes a channel portion, a source contact portion and a first electrode located on opposite sides of the channel portion, and an anode connected to the first electrode;

forming a gate insulating layer on the channel portion, and forming a first metal layer on the gate insulating layer; and forming an insulating layer and a second metal layer above the base layer, the active layer, and the first metal layer, wherein the insulating layer and the second metal layer are stacked, and an opening is defined in the insulating layer at a position corresponding to the anode.

In one embodiment, the step of forming the insulating layer and the second metal layer above the base layer, the active layer, and the first metal layer, wherein the insulating layer and the second metal layer are stacked, and the opening is defined in the insulating layer at the position corresponding to the anode includes:

forming a first insulating layer on the base layer, the active layer, and the first metal layer;

forming a first insulating layer and a second metal layer on the base layer, the active layer, and the first metal layer;

forming a second insulating layer on the first insulating layer and the second metal layer, and forming a fifth via hole in the first insulating layer and the second insulating layer at a position corresponding to the anode; and forming a pixel definition layer on the second insulating layer, and patterning the pixel definition layer to form the opening corresponding to the anode, wherein the opening is located in the fifth via hole.

In one embodiment, the step of forming the insulating layer and the second metal layer above the base layer, the active layer, and the first metal layer, wherein the insulating layer and the second metal layer are stacked, and the opening is defined in the insulating layer at the position corresponding to the anode includes:

forming a first insulating layer on the base layer, the active layer, and the first metal layer;

forming a second metal layer on the first insulating layer, the second metal layer including a second electrode and an auxiliary electrode connected to the source contact portion;

forming a second insulating layer on the first insulating layer and the second metal layer, forming a fifth via hole in the first insulating layer and the second insulating layer at a position corresponding to the anode, and forming a sixth via hole in the second insulating layer at a position corresponding to the auxiliary electrode; and forming a pixel definition layer on the second insulating layer, and patterning the pixel definition layer to form the opening corresponding to the anode and a seventh via hole corresponding to the sixth via hole, wherein the opening is located in the fifth via hole, and a diameter of the seventh via hole is smaller than a diameter of the sixth via hole.

In the present application, the seventh via hole and the opening are fabricated by using a same photomask, and the photomask is a half tone mask (HTM)

In the present application, the channel portion, the source contact portion, the first electrode, and the anode are arranged in the same layer. Compared with the current display panel manufacturing process, the planarization layer is eliminated in structure, and the anode, the first electrode, the channel portion are arranged in the same layer, and the anode is connected to the first electrode, saving the photomask for making the anode and the planarization layer. Meanwhile, the anode is directly formed on the base layer, so that the layer under the anode is relatively flat, which does not impact the normal light emission of the organic light-emitting layer, so that in the process of manufacturing the OLED display panel, three photomasks are omitted compared to the current technology, which simplifies the process flow and reduces the production cost.

DETAILED DESCRIPTION OF PREFERRED EMBODIMENTS

The present application provides an OLED display panel and a manufacturing method thereof. In order to make the purpose, technical solution, and effect of the present application clearer and more definite, the present application is further described in detail below with reference to the accompanying drawings and examples. It should be understood that the specific embodiments described herein are only used to explain the present application, and are not used to limit the present application.

Embodiments of the present application provide a display panel and a manufacturing method thereof, which will be respectively described in detail below. It should be noted that the order of description in the following embodiments is not intended to limit the preferred order of the embodiments.

In order to solve the above technical problems, the present application provides the following technical solutions, with specific reference to FIGS. 2 to 10, and FIGS. 11a to 11h.

Figure 1:
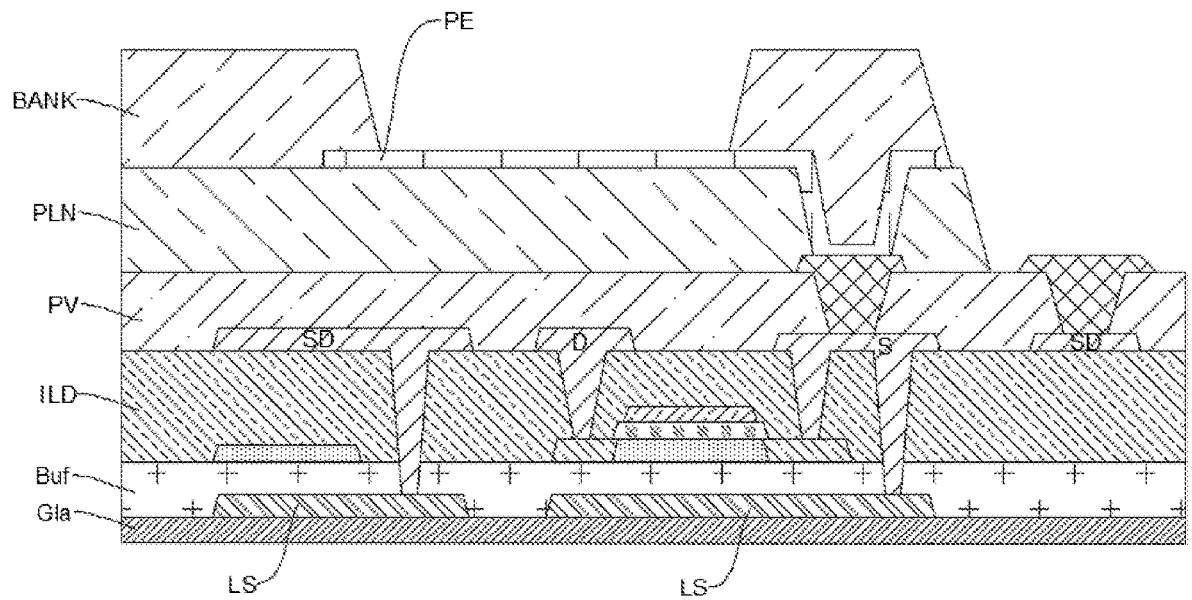
FIG. 1 is a schematic structural diagram of an OLED display panel in the prior art.
Figure 2:
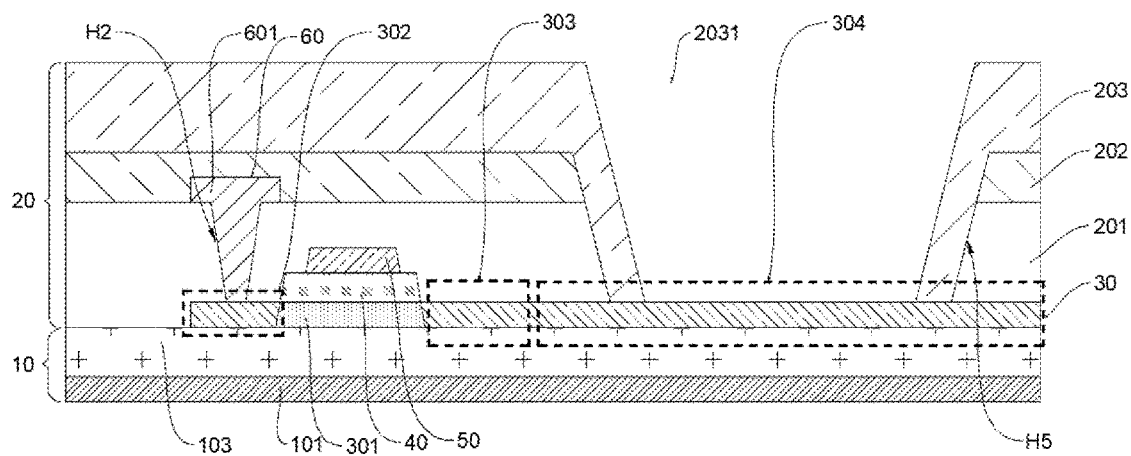
FIG. 2 is a schematic structural diagram of an OLED display panel provided by an embodiment of the present application.

An embodiment of the present application provides an OLED display panel, as shown in FIG. 2, including:
a base layer 10;
an active layer 30 disposed on the base layer 10, wherein the active layer 30 includes a channel portion 301, a source contact portion 302 and a first electrode disposed 303 on opposite sides of the channel portion 301, and an anode 304 connected to the first electrode 303;
a gate insulating layer 40 disposed on the channel portion 301;
a first metal layer 50 disposed on the gate insulating layer 40;
a second metal layer 60 disposed above the first metal layer 50 and including a second electrode 601 connected to the source contact portion 302; and
an insulating layer 20 disposed on the base layer 10 and the active layer 30, wherein the insulating layer 20, the first metal layer 50, and the second metal layer 60 are stacked, and an opening is defined in the insulating layer 20 corresponding to the anode 304.

It should be noted that the OLED display panel includes a plurality of thin film transistor devices, and this embodiment only illustrates the layered structure of one thin film transistor device.

Specifically, the base layer 10 may include a plurality of layers of different materials which are stacked. The materials of the layers include, but are not limited to, glass, polyimide, organic polymer, or metal material, which may be fabricated according to actual needs.

Specifically, in the active layer 30, the material of the channel portion 301 includes a semiconductor material, and the material of each of the source contact portion 302, the first electrode 303, and the anode 304 includes the conductorized semiconductor material, so that the resistivity of the source contact portion 302, the first electrode 303, and the anode 304 is smaller than the resistivity of the channel portion 301. The semiconductor material includes, but is not limited to, IGZO, IZTO, or IGZTO, and this embodiment is described by taking the semiconductor material IGZO as an example; the semiconductor material can be made conductive by plasma doping, which can be performed after the gate and the gate insulating layer 40 are formed.

Specifically, as shown in FIG. 2, an active layer 30 is formed on the base layer 10, and the active layer 30 includes a channel portion 301, a source contact portion 302 and the first electrode 303 disposed on opposite sides of the channel portion 301, and the first electrode 303 and the anode 304 connected to the first electrode 303. The formation of the active layer 30 requires a photomask.

Specifically, the material of the channel portion 301 in the active layer 30 is a semiconductor; the material of the source contact portion 302, the first electrode 303, and the anode 304 may be the conductorized semiconductor material; the channel portion 301, the source contact portion 302, the first electrode 303, and the anode 304 are fabricated in a same layer, and can be formed by a same photomask, which effectively reduces a number of photomasks in the process of manufacturing the OLED display panel, thereby reducing the production cost.

Specifically, a gate insulating layer 40 and a first metal layer 50 are formed on the channel portion 301, the first metal layer 50 may be a gate, and the material of the gate insulating layer 40 includes an inorganic material and a polymeric insulating material. A pre-patterned material layer of the gate insulating layer 40 is firstly formed, then a metal layer is formed on the material layer, and the metal layer is subjected to wet etching to form the first metal layer (gate) 50. Then, the material layer is subjected to dry etching to form the gate insulating layer 40. Due to the existence of the first metal layer 50, the formation of the gate insulating layer 40 does not require an additional photomask, and the formed gate insulating layer 40 at least covers the channel portion 301. After the gate insulating layer 40 is formed, the exposed active layer 30, that is, the structure other than the channel portion 301 covered by the gate insulating layer 40 is conductorized.

Specifically, in the step of forming the gate insulating layer 40 and the gate layer, only one photomask is needed, and conductorization of part of the active layer 30 can be performed directly in the chamber where the gate insulating layer 40 is dry-etched, and then the helium ion plasma (He Plasma) treatment is adopted. Taking IGZO as an example, the O in IGZO (semiconductor material) can be taken away to conductorize IGZO.

Specifically, the second metal layer 60 includes a second electrode 601 (the formation of the second electrode 601 requires one photomask), the second electrode 601 can be a source electrode, the second metal layer 60 is disposed above the first metal layer 50, the first metal layer 50 and the second metal layer 60 are spaced apart by an insulating layer 20 (specifically, the first insulating layer 201), and a second via hole H2 is defined in the first insulating layer 201 at a position corresponding to the second electrode 601 and the source contact portion 302, and the second electrode 601 is connected to the source connection portion 302 through the second via hole H2.

Specifically, the insulating layer includes a first insulating layer 201, a second insulating layer 202, and a pixel definition layer 203. A fifth via hole H5 (the fifth via hole H5 is formed by one photomask) is defined in and penetrates the first insulating layer 201 and the second insulating layer 202, and an opening 2031 is formed on the pixel definition layer 203 at a position corresponding to the anode 304 (the fifth via hole H5), and the opening 2031 is located in the fifth via hole H5 to expose part of the anode 304 (the opening 2031 is formed by one photomask).

It is appreciated that, as shown in FIG. 2, by arranging the channel portion 301, the anode 304, and the first electrode 303 in the same layer, the semiconductor material is conductorized to obtain the materials of the source contact portion 302, the anode 304, and the first electrode 303. Compared with the conventional process of manufacturing an OLED display panel, the planarization layer is eliminated, and the anode 304, the first electrode 303, and the channel portion 301 are fabricated in a same layer, which saves the photomask for forming the anode 304 and the planarization layer; meanwhile, the layer under the anode 304 is relatively flat, which does not impact the normal light emission of the sub-pixels, so that the process of manufacturing the OLED display panel reduces three photomasks compared to the current technology, which simplifies the process flow and reduces the production cost.

Figure 3:
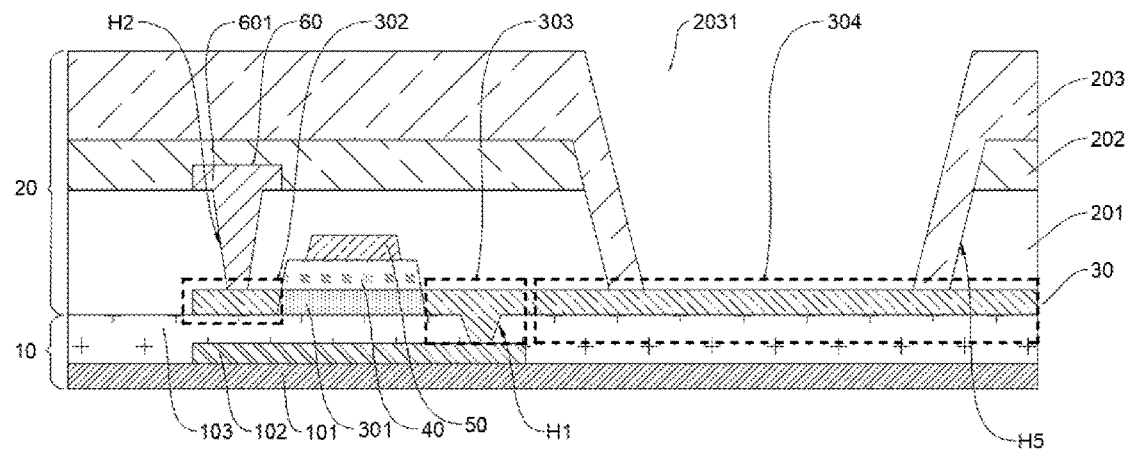
FIG. 3 is a schematic structural diagram of an OLED display panel provided by an embodiment of the present application.

In one embodiment, as shown in FIG. 3, the base layer 10 includes a substrate 101, a light-shielding layer 102, and a buffer layer 103 that are stacked in sequence, and a first via hole H1 is provided above the light-shielding layer 102. The first via hole H1 at least penetrates the buffer layer 103, and the first electrode 303 is connected to the light-shielding layer 102 through the first via hole H1.

Specifically, the material of the light-shielding layer 102 includes a metal or alloy material, which may be one of Mo, Al, Cu, Ti, or an alloy thereof, and the material of the buffer layer 103 includes, but is not limited to, an inorganic insulating material.

Figure 4A:
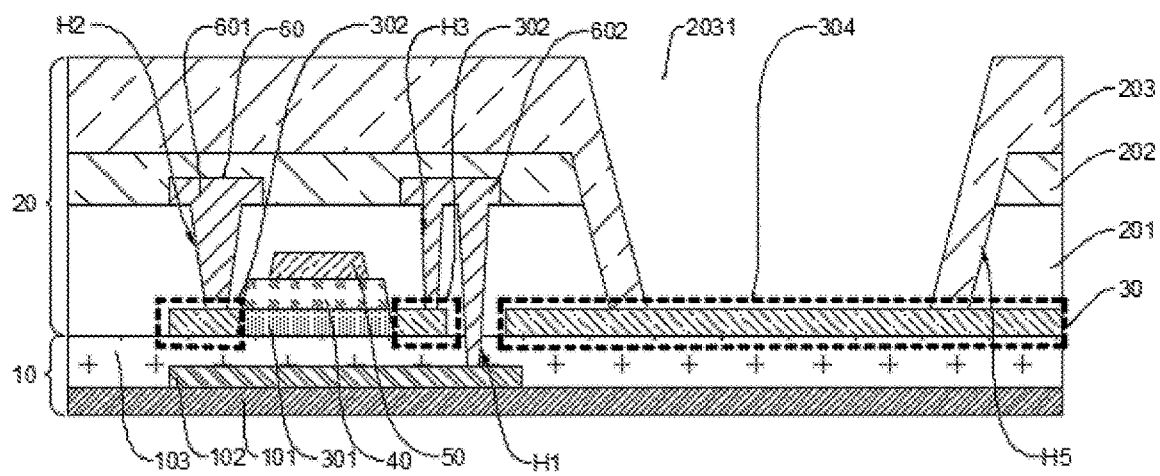
FIG. 4a is a schematic structural diagram of another OLED display panel provided by an embodiment of the present application.
Figure 5:
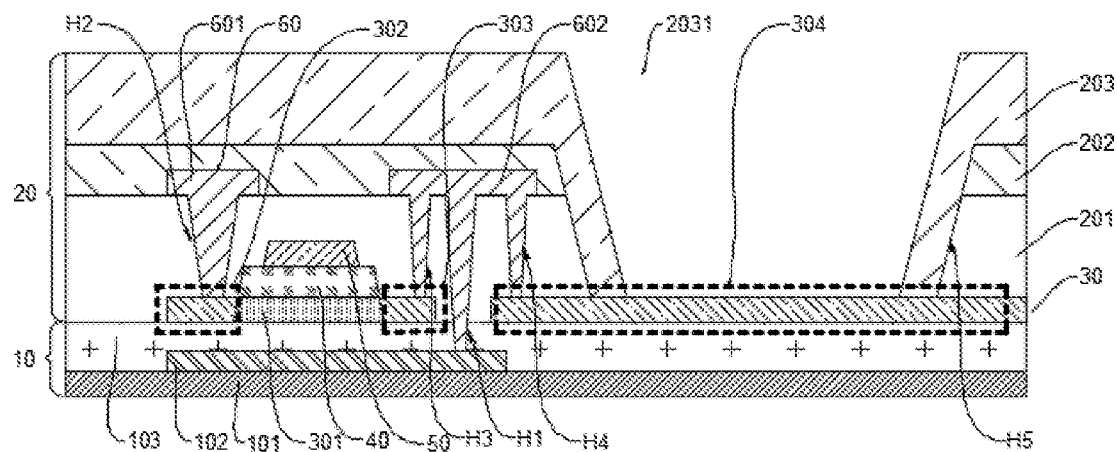
FIG. 5 is a schematic structural diagram of still another OLED display panel provided by an embodiment of the present application.

Specifically, the first via hole H1 may directly correspond to the first electrode 303 and the light-shielding layer 102 as shown in FIG. 3, or, as shown in FIG. 4a and FIG. 5, the first electrode 303 is connected to the light shielding layer 102 through the bridge structure.

Specifically, the active layer 30, the source contact portion 302, the drain electrode (i.e., the first electrode 303), and the anode 304 are fabricated at the same time, which effectively saves the process and cost, and lowers the position of the anode layer to the buffer layer 103, so that the OLED display panel of this embodiment does not need to make additional planarization layer and anode layer, which simplifies the manufacturing process.

Specifically, the display panel includes a plurality of thin film transistors, only one thin film transistor is shown in FIG. 3. In fact, the light-shielding layer 102 may include a plurality of sub light-shielding layers, and FIG. 3 shows one sub light-shielding layer, so the sub light-shielding layer is disposed corresponding to the channel portion 301 of the thin film transistor device on the OLED display panel, and the buffer layer 103 is provided with a first through hole H1 to connect other interlayer structures to the light-shielding layer 102, wherein a total of two photomasks are required to form the first via hole H1 on the light-shielding layer 102 and the buffer layer 103.

It is appreciated that, IGZO and other semiconductor materials are prone to generate photocurrent when irradiated by light, resulting in unstable thin film transistor device, and therefore, the light-shielding layer 102 is arranged under the channel portion 301. Meanwhile, the light-shielding layer 102 is connected to the first electrode 303. On the one hand, the channel portion 301 is shielded from light, and on the other hand, the light-shielding layer 102 diverts the charges accumulated in the channel portion 301 in the thin film transistor device, which is beneficial to improve the stability of the thin film transistor device.

In one embodiment, as shown in FIG. 2, the insulating layer 20 includes a first insulating layer 201 disposed on the active layer 30, and the second metal layer 60 is disposed on the first insulating layer 201. A second through hole H2 is provided at a position corresponding to the second electrode 601 and the source contact portion 302, and the second electrode 601 is connected to the source contact portion 302 through the second through hole H2.

Specifically, a material of the first insulating layer 201 includes silicon nitride, silicon oxide, or a combination thereof.

Specifically, a material of the second metal layer 60 may be one of Mo, Al, Cu, Ti, or an alloy thereof. The second metal layer 60 may include the second electrode 601, the auxiliary electrode 603, or other metal trace structure.

In one embodiment, as shown in FIG. 5, the second metal layer 60 further includes a bridge segment 602 disposed on the first insulating layer 201.

The first insulating layer 201 is provided with a third via hole H3 at a position corresponding to the first electrode 303, the first insulating layer 201 is provided with a fourth via hole H4, and the first electrode 303 is connected to the anode 304 through the bridge segment 602 passing through the third via hole H3 and the fourth via hole H4.

Specifically, a fourth via hole H4 is provided on the first insulating layer 201 at a position corresponding to the anode 304.

Specifically, the connection between the first electrode 303 and the anode 304 may be direct connection in the same layer, as shown in FIG. 2. Alternatively, the connection between the first electrode 303 and the anode 304 may be realized by bridging through the bridging segment 602, as shown in FIG. 4a.

In one embodiment, as shown in FIG. 4a and FIG. 5, the first via hole H1 penetrates the first insulating layer 201, and the first electrode 303 is connected to the light-shielding layer 102 through the bridge segment 602 passing through the third via hole H3 and the first via hole H1.

It is appreciated that, as shown in FIG. 5, the bridging segment 602 and the second metal layer 60 are arranged in the same layer, which can provide a new connection between the first electrode 303 and light-shielding layer 102 without increasing the number of photomasks.

In one embodiment, as shown in FIG. 2, FIG. 3, FIG. 4a, and FIG. 5, the insulating layer 20 further includes a second insulating layer 202 and a pixel definition layer 203 which are stacked. The second insulating layer 202 is arranged on the first insulating layer 201 and the second metal layer 60; and an opening is defined in the pixel definition layer 203; a fifth through hole H5 is defined on the first insulating layer 201 and the second insulating layer 202 at the position corresponding to the anode 304, and the opening 2031 is located in the fifth through hole H5.

Specifically, the material of the second insulating layer 202 includes one or a combination of silicon oxide and silicon nitride.

Specifically, the formed opening 2031 is used to fill the electroluminescent layer, and a cathode layer is further provided on the electroluminescent layer, and the cathode layer cooperates with the anode 304 to make the electroluminescent layer emit light.

Figure 6:
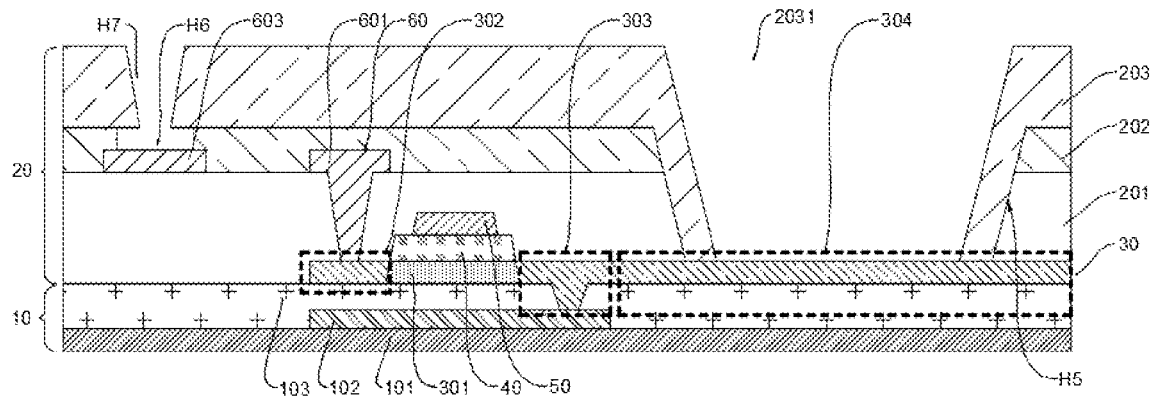
FIG. 6 is a schematic structural diagram of an OLED display panel provided by an embodiment of the present application.

In one embodiment, as shown in FIG. 6, the second metal layer 60 further includes an auxiliary electrode 603 disposed on the first insulating layer 201, and a sixth via hole H6 is defined in the second insulating layer 202 at the position corresponding to the auxiliary electrode 603, and a seventh via hole H7 is defined in the pixel definition layer 203 at the position corresponding to the sixth via hole H6.

The OLED display panel includes an electroluminescent layer disposed on the anode 304, a cathode layer disposed on the electroluminescent layer and the pixel definition layer 203, and the cathode layer is connected to the auxiliary electrode 603 through the sixth via hole H6 and the seventh via hole H7.

It should be noted that, in a large-sized display panel, due to the excessively large area of the display panel, a voltage drop will be generated across the cathode, and the voltage drop will cause the display panel to have an uneven display screen, with bright sides on the periphery and darker in the middle. In order to solve the above technical problems, in this embodiment, an auxiliary electrode 603 is formed in the second metal layer 60, and after an electroluminescent layer is formed in the opening 2031, an entire surface of the electroluminescent layer is formed with the cathode to cover the pixel definition layer 203, and the cathode can be connected to the auxiliary electrode 603 through the sixth via hole H6 and the seventh via hole H7, so as to solve the problem of the voltage drop of the large-sized display panel.

Specifically, the electroluminescent layer includes a hole transport layer, a light-emitting layer, and an electron transport layer which are stacked, and the hole transport layer is connected to the anode 304.

It is appreciated that, forming the auxiliary electrode 603 and the second electrode 601 in the same layer can minimize the number of photomasks used. Compared with the structure without the auxiliary electrode 603, this embodiment can be applied to a large-sized display panel, improve the manufacturing efficiency of the large-sized display panel, reduce the production cost of the large-sized display panel, and at the same time does not impact the display effect of the large-sized display panel.

Figure 4B:
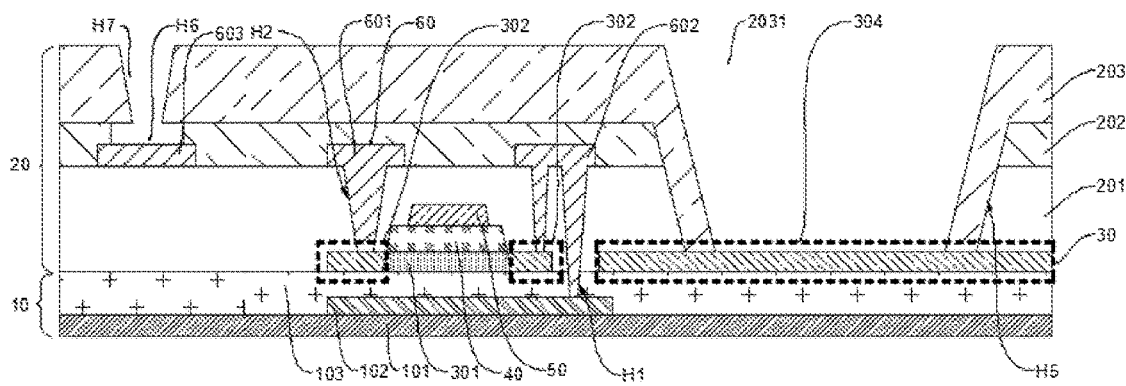
FIG. 4b is a schematic structural diagram of further another OLED display panel provided by an embodiment of the present application.

In one embodiment, as shown in FIGS. 4b and 6, a diameter of the seventh via hole H7 is smaller than a diameter of the sixth via hole H6.

Specifically, as shown in FIG. 6, that a diameter of the seventh via hole H7 is smaller than a diameter of the sixth via hole H6. The term "diameter" means that an orthographic projection of an aperture of a side of the seventh via hole H7 facing the substrate 101 on the substrate 101 covers an orthographic projection of an aperture of a side of the sixth via hole H6 away from the substrate 101 on the substrate 101.

Specifically, when the diameter of the seventh via hole H7 is smaller than the diameter of the sixth via hole H6, the connection between the seventh via hole H7 and the sixth via hole H6 forms an eaves-like structure. The electroluminescent layer is usually made by evaporation, which has directionality. Due to the effect of the eaves-like structure, the electroluminescent layer will not be formed on the auxiliary electrode 603 corresponding to the eaves-like structure. In addition, the cathode is usually formed by magnetron sputtering, which has no directionality, and the formed cathode can fill the sixth via hole H6 without being blocked by the eaves-like structure. Therefore, the cathode can be connected to the auxiliary electrode 603 through the position of a gap on the auxiliary electrode 603 corresponding to the eaves-like structure (that is, the part where an area of the seventh via hole H7 is larger than an area of the sixth via hole H6), and no other additional fabrication methods are required, which simplifies the steps of manufacturing the OLED display panel.

It is appreciated that, on the one hand, when the second metal layer 60 is formed, the auxiliary electrode 603 of the same layer is simultaneously formed, the via hole corresponding to the auxiliary electrode 603 is formed on the second insulating layer 202 and the pixel definition layer 203, and the cathode is connected to the auxiliary electrode 603 through the seventh via hole H7 and the sixth via hole H6, which can effectively reduce the voltage drop of the large-sized display panel and improve the display effect of the display panel. On the other hand, the diameter of the seventh via hole H7 is designed to be greater than the diameter of the sixth via hole H6 to facilitate the connection between the cathode and the auxiliary electrode 603 and simplify the manufacturing difficulty, and there is no need to use an additional etching method to etch the electroluminescence layer deposited on the auxiliary electrode 603 after the electroluminescence layer is fabricated, which simplifies the manufacturing process.

Figure 7:
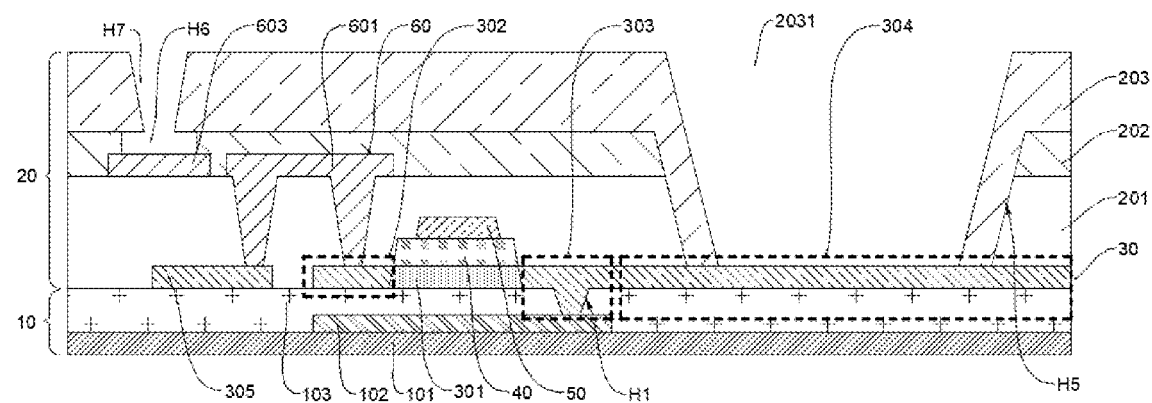
FIG. 7 is a schematic structural diagram of an OLED display panel provided by an embodiment of the present application.

In one embodiment, as shown in FIG. 7, the active layer 30 further includes a signal line segment 305, the first electrode 303 is connected to the signal line segment 305, and the material of the signal line segment 305 is the same as the material of the first electrode 303.

Specifically, the OLED display panel further includes a driver chip, and the line segment can connect the first electrode 303 to the driver chip, so as to control the luminance of the electroluminescent layer.

It is appreciated that the use of conductorized IGZO to fabricate part of the wiring can further simplify the layered structure of the OLED display panel without having a great impact on the normal display of the display panel.

Figure 8:
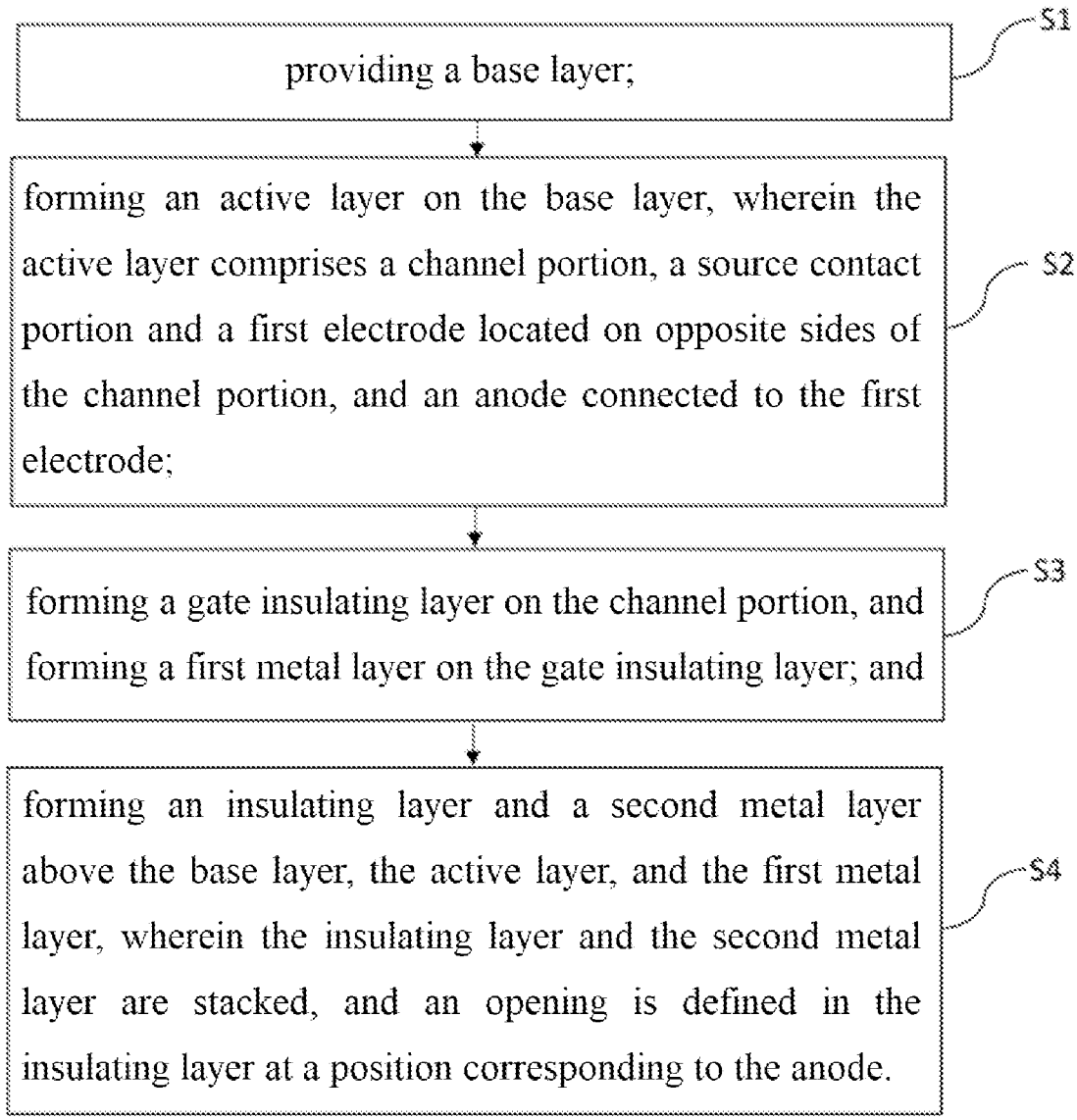
FIG. 8 is a manufacturing flowchart of an OLED display panel provided by an embodiment of the present application.

The present application also provides a method of manufacturing an OLED display panel, as shown in FIG. 8, including the following steps:

S1, providing a base layer 10;

Specifically, the material of the substrate 101 includes glass, the material of the light-shielding layer 102 includes a metal or an alloy material, which may be one of Mo, Al, Cu, Ti, or an alloy thereof, and the material of the buffer layer 103 includes a stack of silicon oxide and silicon nitride.

Specifically, the light-shielding layer 102 is formed on the substrate 101 by a deposition method, and the deposition method of the light-shielding layer 102 includes physical vapor deposition (PVD), chemical vapor deposition (CVD) and plasma chemical vapor deposition (PCVD).

S2. forming an active layer 30 on the base layer 10, wherein the active layer 30 includes a channel portion 301, a source contact portion 302 and a first electrode located 303 on opposite sides of the channel portion 301, and an anode 304 connected to the first electrode 303.

Specifically, a photomask is required to form the active layer 30. In step S2, the source contact portion 302, the first electrode 303, and the anode 304 may be made of semiconductor materials that have not been conductorized. After the gate is formed subsequently, they are conductorized by plasma doping, while the gate can serve as a mask for the channel portion 301.

S3, forming a gate insulating layer 40 on the channel portion 301, and forming a first metal layer 50 on the gate insulating layer 40.

Specifically, the material of the gate insulating layer 40 includes silicon oxide, the first metal layer 50 includes a gate electrode, and the material of the first metal layer 50 includes one of Mo, Al, Cu, Ti, or an alloy thereof.

Specifically, a layer of material of the gate insulating layer 40 is formed first, and then a layer of metal layer is formed on the material of the gate insulating layer 40. Wet etching may be used to etch metal layer first to form the first metal layer (gate) 50, and then dry etching is used to etch the insulating material layer to form the gate insulating layer 40. This process is realized by one photomask (the gate can correspondingly serve as the photomask structure for etching the gate insulating layer 40).

Specifically, the above-mentioned etching means are not limited to wet etching or dry etching, and the etching means include but are not limited to chemical etching, electrolytic etching, ion beam sputtering etching, plasma etching, reactive particle etching, etc. In this embodiment, the first metal layer 50 is chemically etched, and the etchant used may be hydrofluoric acid.

Specifically, after the gate and the gate insulating layer 40 are formed, the structure of the exposed active layer 30 beyond the gate insulating layer 40 (the source contact portion 302, the first electrode 303, the line segment, and the anode 304) is conductorized.

S4, forming an insulating layer 20 and a second metal layer 60 above the base layer 10, the active layer 30, and the first metal layer 50, and the insulating layer 20 and the second metal layer 60 are stacked. An opening 2031 is formed in the insulating layer 20 corresponding to the position of the anode 304.

Specifically, the insulating layer 20 includes a first insulating layer 201, a second insulating layer 202, and a pixel definition layer 203.

Figure 9:
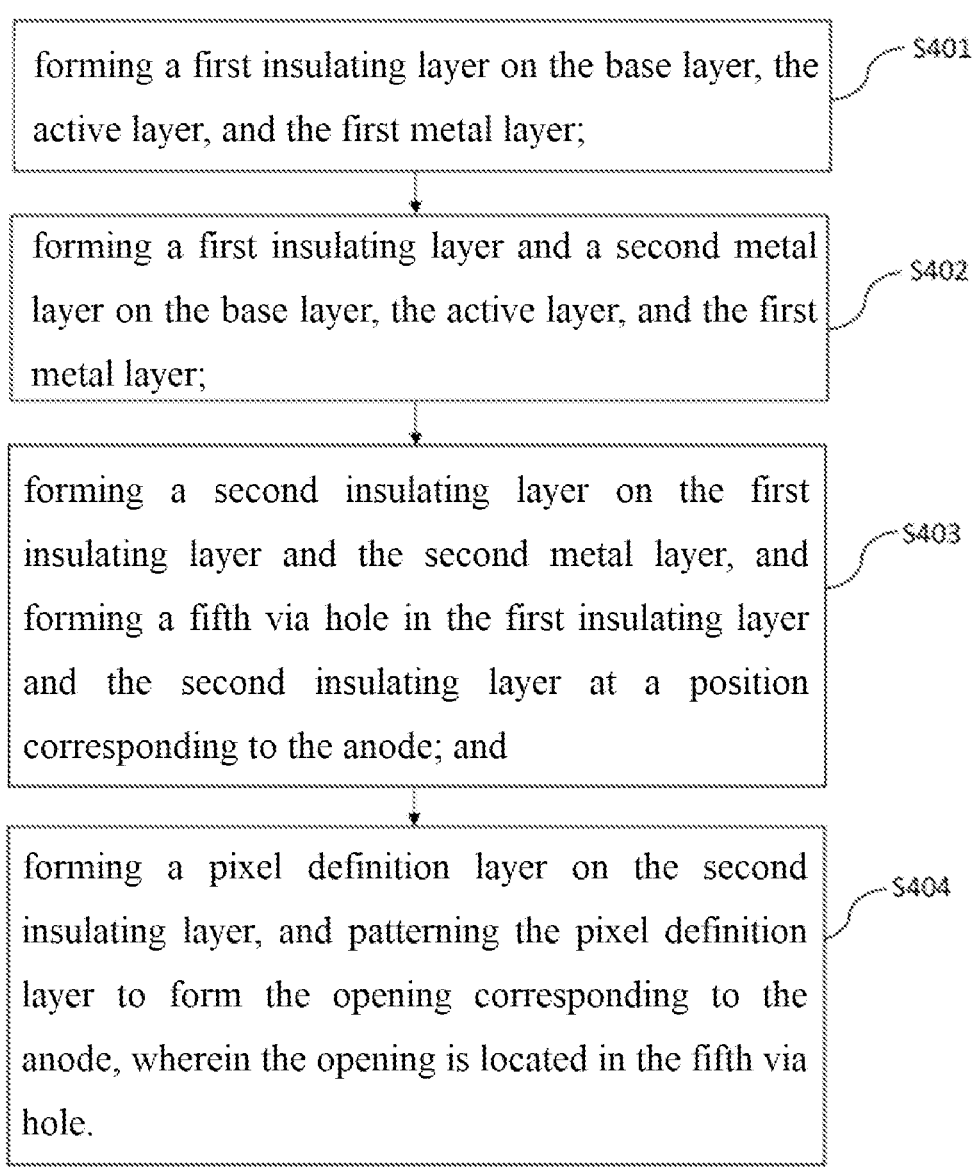
FIG. 9 is a manufacturing flowchart of an OLED display panel provided by an embodiment of the present application.

Specifically, as shown in FIG. 9, the step S4 specifically includes the following steps:

S401, forming a first insulating layer 201 on the base layer 10, the active layer 30, and the first metal layer 50;

S402, forming a first insulating layer 201 and a second metal layer 60 on the base layer 10, the active layer 30, and the first metal layer 50;

S403, forming a second insulating layer 202 on the first insulating layer 201 and the second metal layer 60, and forming a fifth via hole H5 in the first insulating layer 201 and the second insulating layer 202 at a position corresponding to the anode 304; and S404, forming a pixel definition layer 203 on the second insulating layer 202, and patterning the pixel definition layer 203 to form the opening 2031 corresponding to the anode 304, wherein the opening 2031 is located in the fifth via hole H5.

It should be noted that, after the opening 2031 is formed, an organic light-emitting layer may be sequentially formed in the opening 2031 by inkjet printing, and the organic light-emitting layer includes a hole injection layer, a hole transport layer, a light-emitting layer, electron transport layer, and electron injection layer.

It is appreciated that the channel portion 301, the anode 304 and the first electrode 303 are arranged in the same layer, and the materials of the source contact portion 302, the anode 304 and the first electrode 303 are obtained by conductorizing the semiconductor material of the channel portion 301. Compared with the current conventional process of manufacturing an OLED display panel, the planarization layer is eliminated, and the anode 304, the first electrode 303, and the channel portion 301 are fabricated in a same layer, which saves the photomask for forming the anode 304 and the planarization layer. Meanwhile, the anode 304 is directly formed on the buffer layer 103, so that the layer under the anode 304 is relatively flat, which does not impact the normal light emission of the organic light-emitting layer, so that in the process of manufacturing the OLED display panel, three photomasks are omitted compared to the current technology, which simplifies the process flow and reduces the production cost.

Figure 10:
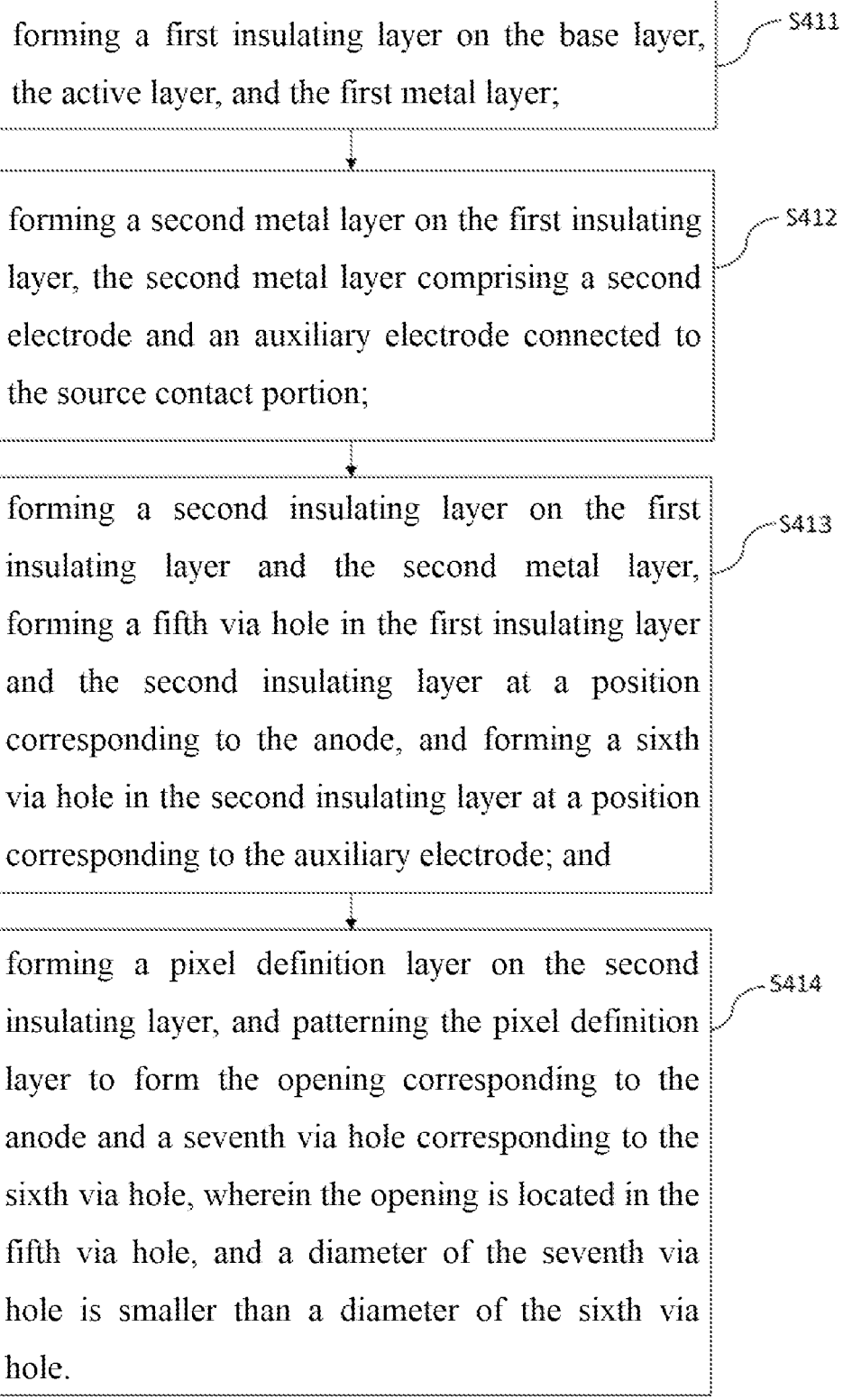
FIG. 10 is a manufacturing flowchart of an OLED display panel provided by an embodiment of the present application.

In another embodiment, as shown in FIG. 10, the step S4 includes:

S411, forming a first insulating layer 201 on the base layer 10, the active layer 30, and the first metal layer 50;

S412, forming a second metal layer 60 on the first insulating layer 201, wherein the second metal layer 60 includes a second electrode 601 and an auxiliary electrode 603 connected to the source contact portion 302;

S413, forming a second insulating layer 202 on the first insulating layer 201 and the second metal layer 60, forming a fifth via hole H5 in the first insulating layer 201 and the second insulating layer 202 at a position corresponding to the anode 304, and forming a sixth via hole H6 on the second insulating layer 202 at a position corresponding to the auxiliary electrode 603;

Specifically, the fifth via hole H5 and the sixth via hole H6 are implemented by using the same photomask.

S414, forming a pixel definition layer 203 on the second insulating layer 202, patterning the pixel definition layer 203 to form an opening 2031 corresponding to the anode 304 and a seventh via hole H7 corresponding to the sixth via hole H6, wherein the opening 2031 is located in the fifth via hole H5, and the diameter of the seventh via hole H7 is smaller than the diameter of the sixth via hole H6.

Specifically, the seventh via hole H7 and the opening 2031 may be fabricated by using the same photomask, the photomask is a half tone mask (HTM), and a position corresponding to the sixth via hole H6 in the HTM is a fully transparent structure, and a position corresponding to the opening 2031 is a semi-transparent structure.

It is appreciated that when the second metal layer 60 is formed, the auxiliary electrode 603 of the same layer is simultaneously formed, the via hole corresponding to the auxiliary electrode 603 is formed on the second insulating layer 202 and the pixel definition layer 203, and the cathode is connected to the auxiliary electrode 603 through the seventh via hole H7 and the sixth via hole H6, which can effectively reduce the voltage drop of the large-sized display panel and improve the display effect of the display panel. On the other hand, the diameter of the seventh via hole H7 is designed to be greater than the diameter of the sixth via hole H6 to facilitate the connection between the cathode and the auxiliary electrode 603 and simplify the manufacturing difficulty, and there is no need to use an additional etching method to etch the electroluminescence layer deposited on the auxiliary electrode 603 after the electroluminescence layer is fabricated, which simplifies the manufacturing process.

Figure 11A:
FIG. 11a is a schematic diagram of a process of manufacturing an OLED display panel provided by an embodiment of the present application.

In a specific embodiment, the process of manufacturing an OLED display panel is shown in FIGS. 11a-11h, including:

As shown in FIG. 11a, a substrate 101 is provided, and a light-shielding layer 102 is formed on the substrate 101, wherein a photomask used in this step is the first photomask in the manufacturing process.

Figure 11B:
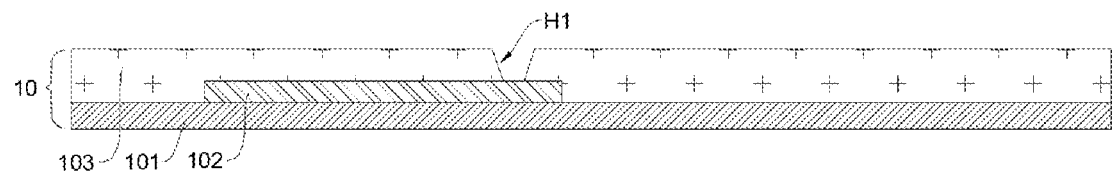
FIG. 11b is a schematic diagram of a process of manufacturing an OLED display panel provided by an embodiment of the present application.

As shown in FIG. 11b, a buffer layer 103 is formed on the light-shielding layer 102 and the substrate 101, and a first via hole H1 is formed on the buffer layer 103. The photomask used in this step is the second photomask in the manufacturing process.

Figure 11C:
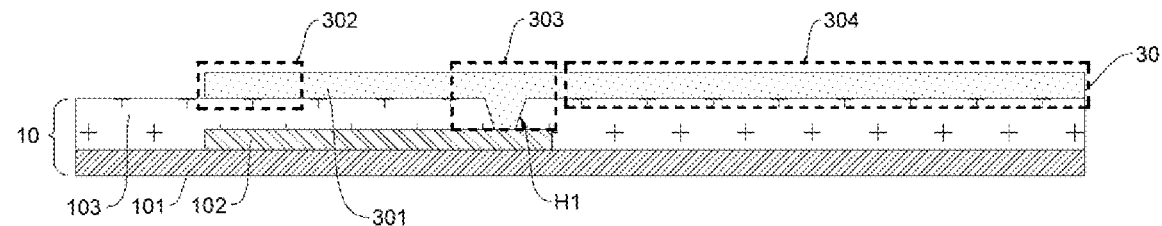
FIG. 11c is a schematic diagram of a process of manufacturing an OLED display panel provided by an embodiment of the present application.

As shown in FIG. 11c, an active layer 30 is formed on the buffer layer 103. At this time, the material of the active layer 30 is a semiconductor material. The active layer 30 includes a channel portion 301, a source contact portion 302 and the first electrode 303 located on opposite sides of the channel portion 301, and an anode 304 connected to the first electrode 303, wherein the first electrode 303 is connected to the light-shielding layer 102. At this time, the materials of the electrode 303 and the anode 304 have not been conductorized, and the photomask used in this step is the third photomask in the manufacturing process.

Figure 11D:
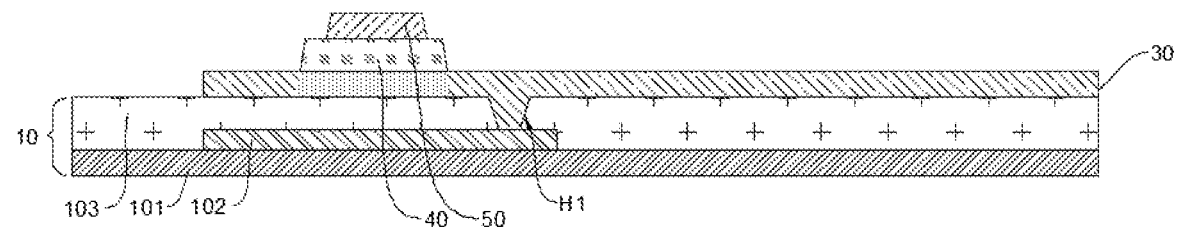
FIG. 11d is a schematic diagram of a process of manufacturing an OLED display panel provided by an embodiment of the present application.

As shown in FIG. 11d, a gate insulating layer 40 is formed on the channel portion 301, a first metal layer 50 is formed on the gate insulating layer 40, and then the exposed portion of the active layer is conductorized, that is, the materials of the source contact portion 302, the first electrode 303, and the anode 304 are conductorized, and the photomask used in this step is the fourth photomask in the manufacturing process.

Figure 11E:
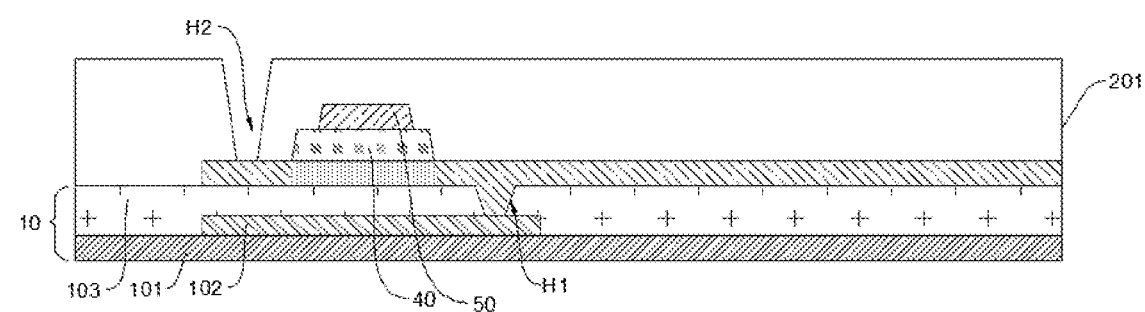
FIG. 11e is a schematic diagram of a process of manufacturing an OLED display panel provided by an embodiment of the present application.

As shown in FIG. 11e, a first insulating layer 201 is formed on the base layer 10, the active layer 30, and the first metal layer 50; a second via hole H2 is formed on the first insulating layer 201; and the photomask used in this step is the fifth photomask in the manufacturing process.

Figure 11F:
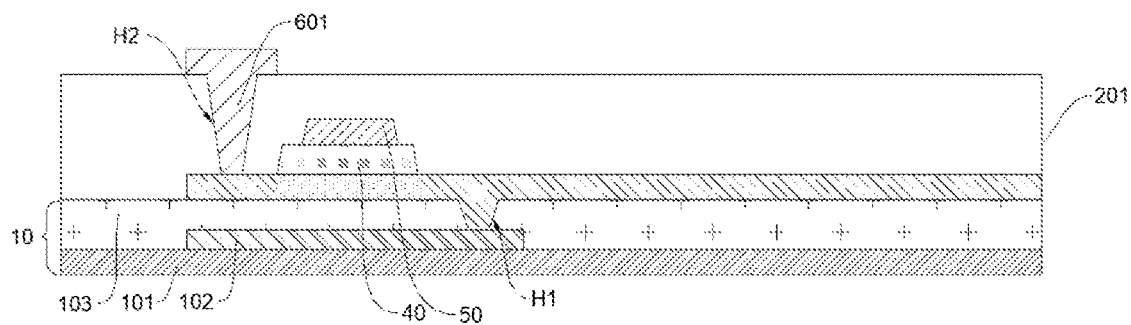
FIG. 11f is a schematic diagram of a process of manufacturing an OLED display panel provided by an embodiment of the present application.
Figure 11G:
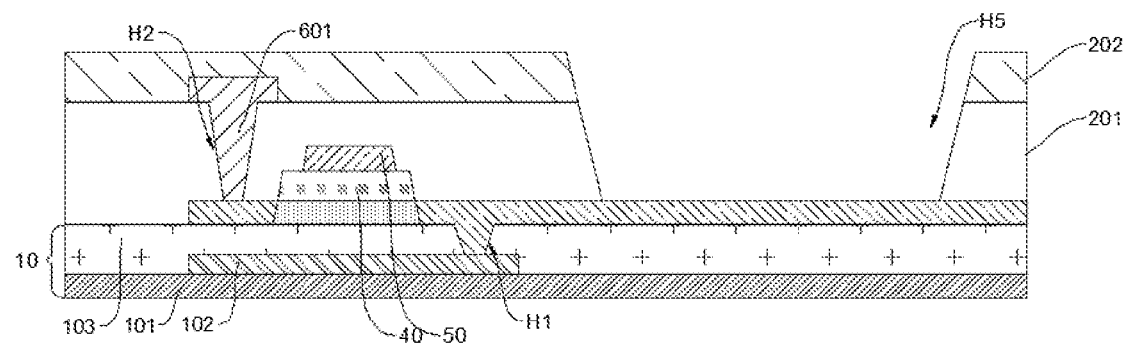
FIG. 11g is a schematic diagram of a process of manufacturing an OLED display panel provided by an embodiment of the present application.
Figure 11H:
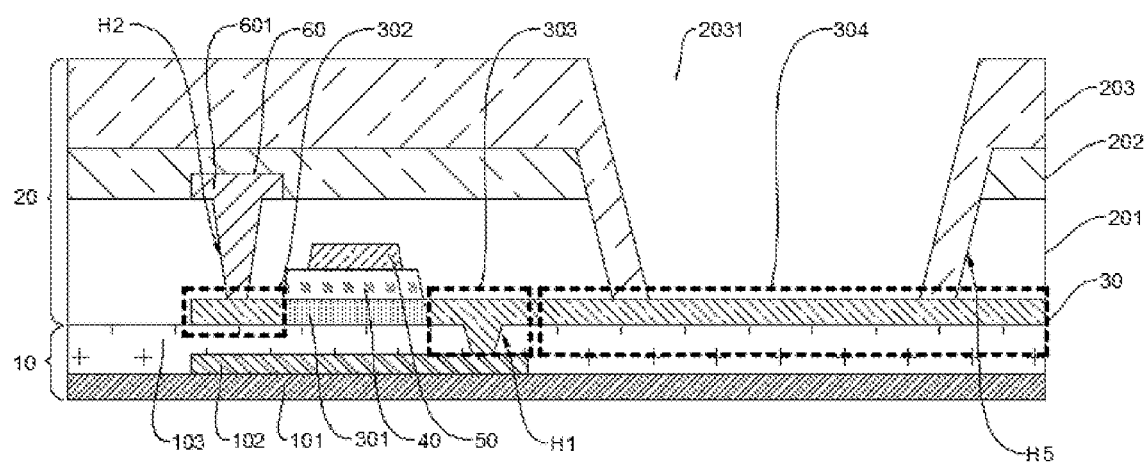
FIG. 11h is a schematic diagram of a process of manufacturing an OLED display panel provided by an embodiment of the present application.

As shown in FIG. 11f, a second metal layer 60 is formed on the first insulating layer 201, and the second metal layer 60 is patterned to form a second electrode 601. The photomask used in this step is the sixth photomask in the manufacturing process;

As shown in FIG. 11g, a second insulating layer is formed on the second metal layer 60 and the first insulating layer 201. A fifth via hole H5 is formed on the first insulating layer 201 and the second insulating layer 202 at the position corresponding to the anode 304, and the photomask used in this step is the seventh photomask in the manufacturing process;

As shown in FIG. 11h, a pixel definition layer 203 is formed on the second insulating layer 202, and the pixel definition layer 203 is patterned to form an opening 2031 corresponding to the anode 304, and the opening 2031 is located in the fifth via hole H5. The photomask used in this step is the eighth photomask in the manufacturing process.

Figure 12A:
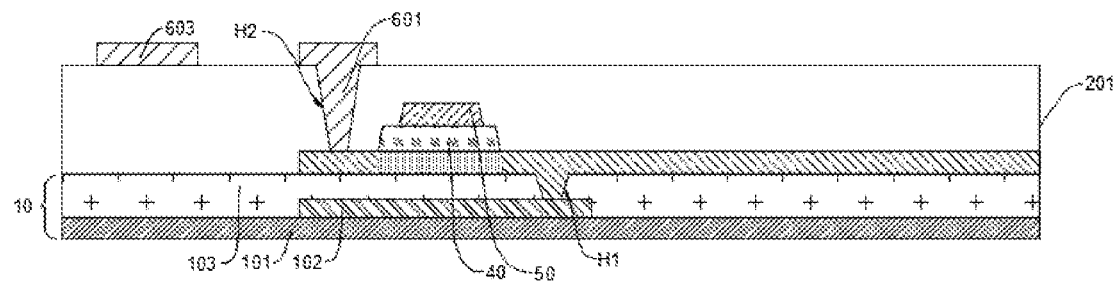
FIG. 12a is a schematic diagram of a process of manufacturing another OLED display panel provided by an embodiment of the present application.
Figure 12B:
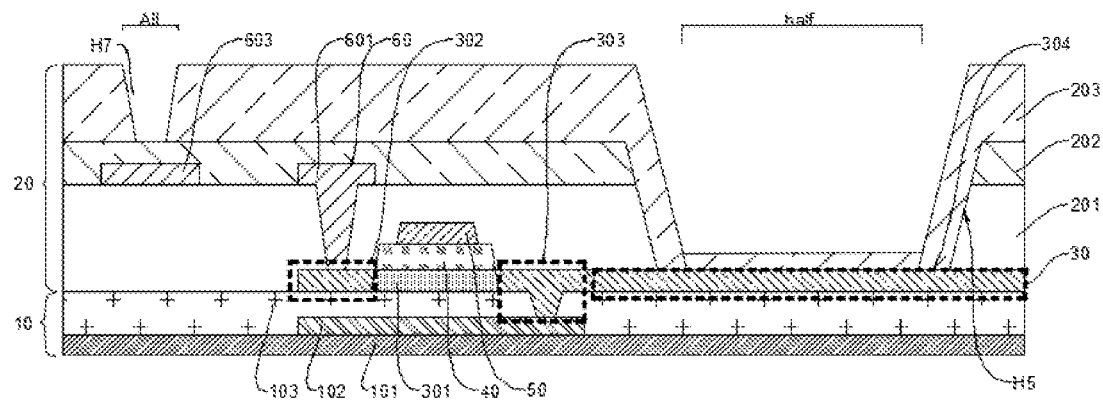
FIG. 12b is a schematic diagram of a process of manufacturing another OLED display panel provided by an embodiment of the present application.
Figure 12C:
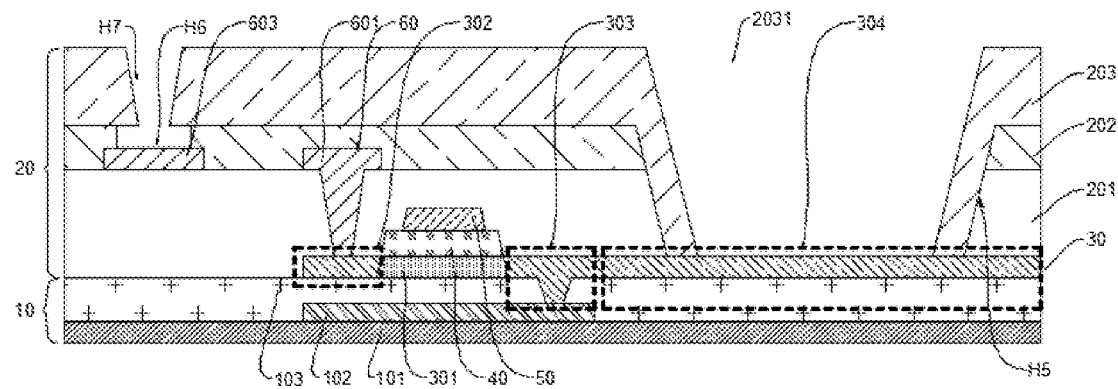
FIG. 12c is a diagram of a manufacturing process of another OLED display panel provided by an embodiment of the present application.

In another specific embodiment, as shown in FIGS. 12a-12c, the use of the first to the fifth photomasks is the same as that of the previous embodiment, and the differences are:

As shown in FIG. 12a, when the second electrode 601 is formed by the sixth photomask, the auxiliary electrode 603 is also formed simultaneously;

A second insulating layer is formed on the second metal layer 60 and the first insulating layer 201. A fifth via hole H5 is formed on the first insulating layer 201 and the second insulating layer 202 at the position corresponding to the anode 304, and the photomask used in this step is the seventh photomask in the manufacturing process.

As shown in FIG. 12b, a pixel definition layer 203 is formed on the second insulating layer 202, and the pixel definition layer 203 is patterned to form an opening 2031 corresponding to the anode 304, the opening 2031 is located in the fifth via hole H5, and the photomask used in this step is the eighth photomask in the manufacturing process, wherein the eighth photomask also needed to form a seventh via hole H7, and the eighth photomask is a half-tone mask (HTM). A fully transparent photomask is located at a position where the seventh via hole H7 is formed (the corresponding position marked by "All" in FIG. 12b), and a semi-transparent photomask is located at a position where the opening 2031 is formed (the corresponding position marked by "half" in FIG. 12b). After etching, a part of the material of the pixel definition layer 203 is left on the anode 304 at the position corresponding to the opening 2031.

As shown in FIG. 12c, the sixth via hole H6 is formed through the ninth photomask, then wet-etched with hydrofluoric acid to form an undercut structure, and then the pixel definition layer material remaining on the anode 304 is etched by plasma of Ar gas to form an opening 2031.

In view of above, in the present application, the channel portion 301, the anode 304, and the first electrode 303 are arranged in the same layer, and the anode and the first electrode 303 are obtained by conductorizing semiconductor materials. Compared with the current conventional process of manufacturing an OLED display panel, a number of planarization layer is reduced, while the layer under the anode 304 is relatively flat, which does not impact the normal light emission of the sub-pixels, so that the process of manufacturing the OLED display panel saves three photomasks compared with the current technology, which simplifies the process flow and reduces the production cost.

It is appreciated that for those of ordinary skill in the art, equivalent substitutions or changes can be made according to the technical solutions and inventive concepts of the present application, and all these changes or substitutions shall fall within the protection scope of the appended claims of the present application.

What is claimed is:

1. An organic light-emitting diode (OLED) display panel, comprising:
    a base layer;
    an active layer disposed on the base layer, wherein the active layer comprises a channel portion, a source contact portion and a first electrode disposed on opposite sides of the channel portion, and an anode connected to the first electrode;
    a gate insulating layer disposed on the channel portion;
    a first metal layer disposed on the gate insulating layer;
    a second metal layer disposed above the first metal layer and comprising a second electrode connected to the source contact portion; and
    an insulating layer disposed on the base layer and the active layer, wherein the insulating layer, the first metal layer, and the second metal layer are stacked, and an opening is defined in the insulating layer corresponding to the anode.

2. The OLED display panel according to claim 1, wherein a resistivity of the source contact portion, the first electrode, and the anode is smaller than a resistivity of the channel portion.

3. The OLED display panel according to claim 2, wherein the active layer further comprises a signal line segment, the first electrode is connected to the signal line segment, and a material of the signal line segment is same as a material of the first electrode.

4. The OLED display panel according to claim 2, wherein the base layer comprises a substrate, a light-shielding layer, and a buffer layer stacked in sequence; a first via hole is defined above the light-shielding layer, the first via hole penetrates at least the buffer layer, and the first electrode is connected to the light-shielding layer through the first via hole.

5. The OLED display panel according to claim 4, wherein the insulating layer comprises a first insulating layer disposed on the active layer, the second metal layer is disposed on the first insulating layer, a second via hole is defined in the first insulating layer at a position corresponding to the second electrode and the source contact portion, and the second electrode is connected to the source connection portion through the second via hole.

6. The OLED display panel according to claim 5, wherein the active layer further comprises a signal line segment, the first electrode is connected to the signal line segment, and a material of the signal line segment is same as a material of the first electrode.

7. The OLED display panel according to claim 5, wherein the second metal layer further comprises a bridge segment disposed on the first insulating layer; and
wherein the first insulating layer is defined with a third via hole at a position corresponding to the first electrode, a fourth via hole is defined in the first insulating layer, and the first electrode is connected to the anode through the bridge segment passing through the third via hole and the fourth via hole.

8. The OLED display panel according to claim 7, wherein the first via hole penetrates the first insulating layer, and the first electrode is connected to the light-shielding layer through the bridge segment passing through the third via hole and the first via hole.

9. The OLED display panel according to claim 8, wherein the insulating layer further comprises a second insulating layer and a pixel definition layer which are stacked, the second insulating layer is disposed on the first insulating layer and the second metal layer, the opening is defined in the pixel definition layer, and a fifth via hole is defined in the first insulating layer and the second insulating layer at a position corresponding to the anode, and the opening is located in the fifth via hole.

10. The OLED display panel according to claim 9, wherein the active layer further comprises a signal line segment, the first electrode is connected to the signal line segment, and a material of the signal line segment is same as a material of the first electrode.

11. The OLED display panel according to claim 5, wherein the insulating layer further comprises a second insulating layer and a pixel definition layer which are stacked, the second insulating layer is disposed on the first insulating layer and the second metal layer, the opening is defined in the pixel definition layer, and a fifth via hole is defined in the first insulating layer and the second insulating layer at a position corresponding to the anode, and the opening is located in the fifth via hole.

12. The OLED display panel according to claim 11, wherein the second metal layer further comprises an auxiliary electrode disposed on the second insulating layer, a sixth via hole is defined in the second insulating layer at a position corresponding to the auxiliary electrode, a seventh via hole is defined in the pixel definition layer at a position corresponding to the sixth via hole; and
wherein the OLED display panel comprises an electroluminescence layer disposed on the anode, a cathode layer disposed on the electroluminescence layer and the pixel definition layer, and the cathode layer is connected to the auxiliary electrode through the fifth via hole and the sixth via hole.

13. The OLED display panel according to claim 12, wherein a diameter of the seventh via hole is smaller than a diameter of the sixth via hole.

14. The OLED display panel according to claim 13, wherein the active layer further comprises a signal line segment, the first electrode is connected to the signal line segment, and a material of the signal line segment is same as a material of the first electrode.

15. The OLED display panel according to claim 1, wherein the active layer further comprises a signal line segment, the first electrode is connected to the signal line segment, and a material of the signal line segment is same as a material of the first electrode.

16. An organic light-emitting diode (OLED) display panel, comprising:
a base layer;
an active layer disposed on the base layer, wherein the active layer comprises a channel portion, a source contact portion and a first electrode disposed on opposite sides of the channel portion, and an anode connected to the first electrode;
a gate insulating layer disposed on the channel portion;
a first metal layer disposed on the gate insulating layer;
a second metal layer disposed above the first metal layer and comprising a second electrode connected to the source contact portion; and
an insulating layer disposed on the base layer and the active layer, wherein the insulating layer, the first metal layer, and the second metal layer are stacked, and an opening is defined in the insulating layer corresponding to the anode;
wherein the insulating layer comprises a first insulating layer disposed on the active layer, the second metal layer is disposed on the first insulating layer, a second via hole is defined in the first insulating layer at a position corresponding to the second electrode and the source contact portion, and the second electrode is connected to the source connection portion through the second via hole;
wherein the insulating layer further comprises a second insulating layer and a pixel definition layer which are stacked, the second insulating layer is disposed on the first insulating layer and the second metal layer, the opening is defined in the pixel definition layer, and a fifth via hole is defined in the first insulating layer and the second insulating layer at a position corresponding to the anode, and the opening is located in the fifth via hole.

17. An organic light-emitting diode (OLED) display panel, comprising:
a base layer;

an active layer disposed on the base layer, wherein the active layer comprises a channel portion, a source contact portion and a first electrode disposed on opposite sides of the channel portion, and an anode connected to the first electrode;
a gate insulating layer disposed on the channel portion;
a first metal layer disposed on the gate insulating layer;
a second metal layer disposed above the first metal layer and comprising a second electrode connected to the source contact portion; and
an insulating layer disposed on the base layer and the active layer, wherein the insulating layer, the first metal layer, and the second metal layer are stacked, and an opening is defined in the insulating layer corresponding to the anode;
wherein the insulating layer comprises a first insulating layer disposed on the active layer, the second metal layer is disposed on the first insulating layer, a second via hole is defined in the first insulating layer at a position corresponding to the second electrode and the source contact portion, and the second electrode is connected to the source connection portion through the second via hole;
wherein the second metal layer further comprises a bridge segment disposed on the first insulating layer; and
wherein the first insulating layer is defined with a third via hole at a position corresponding to the first electrode, a fourth via hole is defined in the first insulating layer, and the first electrode is connected to the anode through the bridge segment passing through the third via hole and the fourth via hole.

\* \* \* \* \*